(12) United States Patent
Pyeon

(10) Patent No.: US 7,742,551 B2
(45) Date of Patent: Jun. 22, 2010

(54) PULSE COUNTER WITH CLOCK EDGE RECOVERY

(75) Inventor: Hong Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 996 days.

(21) Appl. No.: 11/495,609

(22) Filed: Jul. 31, 2006

(65) Prior Publication Data

US 2008/0025457 A1    Jan. 31, 2008

(51) Int. Cl.
H04L 7/00    (2006.01)
(52) U.S. Cl. ...................... 375/354; 377/118
(58) Field of Classification Search ........... 375/354; 377/118–128
See application file for complete search history.

(56) References Cited

U.S. PATENT DOCUMENTS

| 3,894,246 A | 7/1975 | Torgrim |
| 4,521,898 A | 6/1985 | Akram |
| 4,612,658 A | 9/1986 | Eby |
| 4,862,407 A | 8/1989 | Fette et al. |
| 4,891,827 A | 1/1990 | Slater |
| 5,060,243 A | 10/1991 | Eckert |
| 5,287,478 A * | 2/1994 | Johnston et al. ............. 711/111 |
| 5,822,579 A | 10/1998 | Wichman |
| 6,026,140 A | 2/2000 | Owen |
| 6,064,712 A | 5/2000 | Diamondstein et al. |
| 6,853,698 B1 | 2/2005 | Nguyen |
| 6,946,881 B1 * | 9/2005 | Chan ........................... 327/28 |
| 6,987,823 B1 * | 1/2006 | Stark et al. ................... 375/354 |

FOREIGN PATENT DOCUMENTS

| JP | 55047736 | 4/1980 |
| JP | 57073522 | 5/1982 |
| JP | 02108326 | 4/1990 |
| JP | 02206222 | 8/1990 |
| JP | 04302527 | 10/1992 |
| JP | 04306911 | 10/1992 |
| JP | 2000059206 | 2/2000 |
| JP | 2001313563 | 11/2001 |

\* cited by examiner

Primary Examiner—Curtis B Odom

(57) ABSTRACT

An apparatus and a method for counting input pulses during a specific time interval are provided. A clock edge recovery output signal is produced in response to an input gating signal and a clock signal containing the input pulses. The clock edge recovery output signal contains a respective full clock pulse for each of either the rising or falling edge of the input pulses of the clock signal that occurs while the input gating signal is in an enable state and when the input gating signal transitions from the enable state to the disable state. A counter circuit counts the pulses contained in the clock edge recovery output signal.

18 Claims, 10 Drawing Sheets

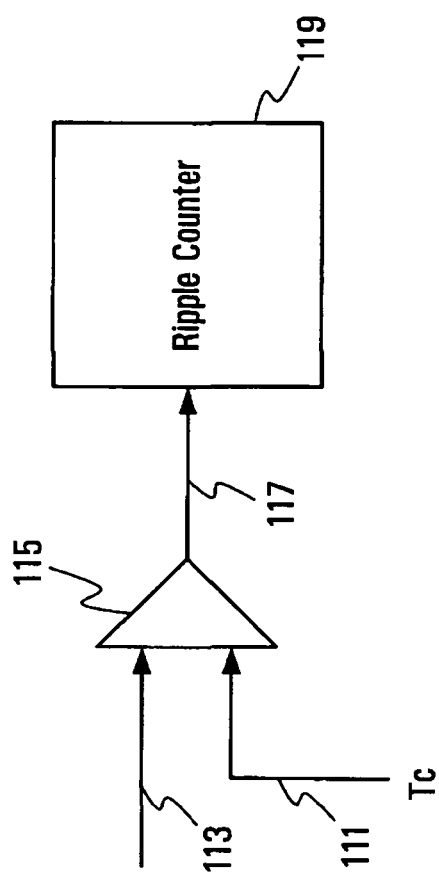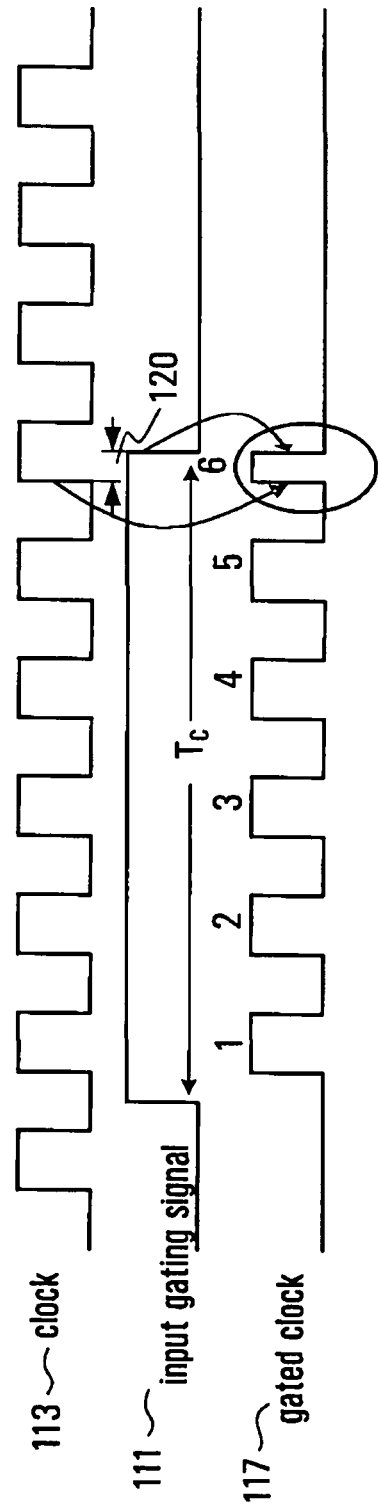
FIG. 1A
FIG. 1B

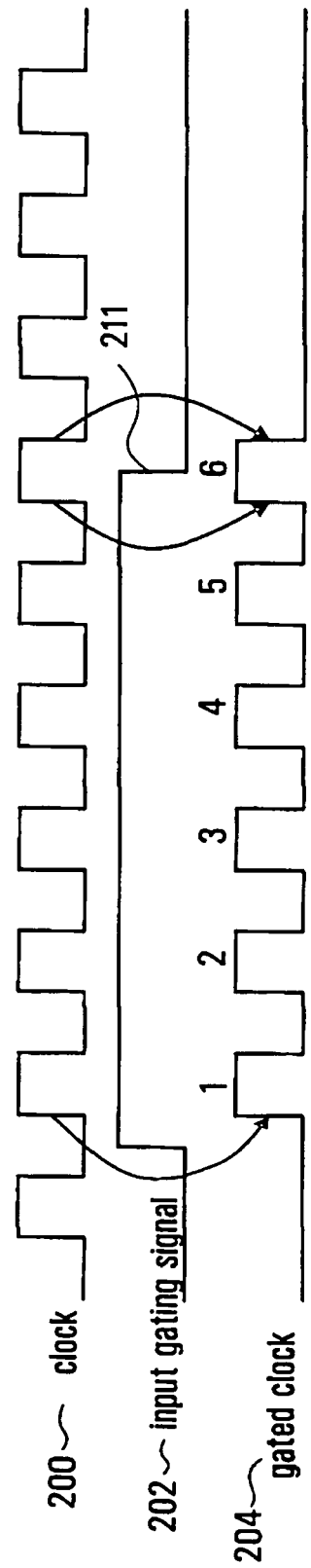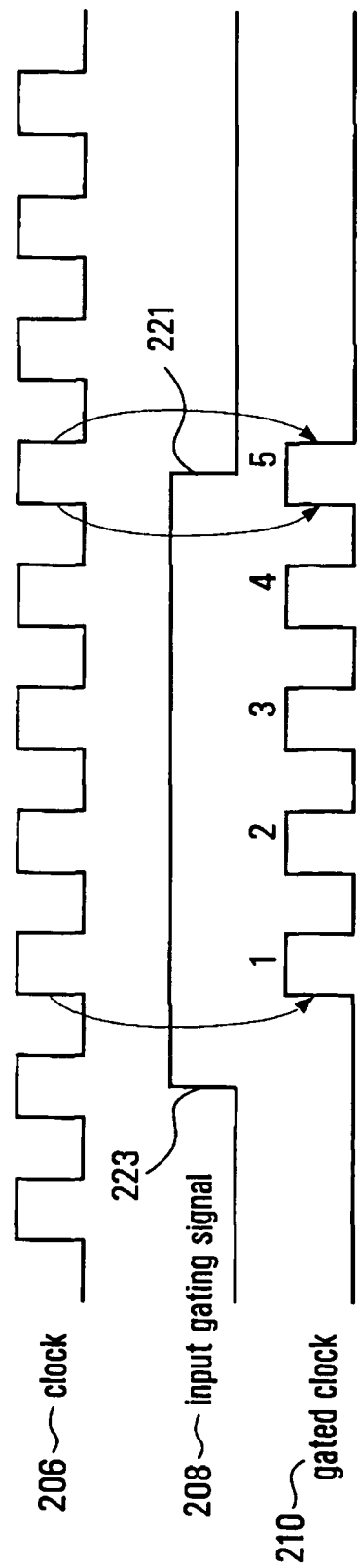
FIG. 2A
FIG. 2B

PULSE COUNTER WITH CLOCK EDGE RECOVERY

FIELD OF THE INVENTION

The present invention relates generally to an apparatus for counting input pulses and in particular, to a pulse counter with a function of clock edge recovery.

BACKGROUND OF THE INVENTION

In digital systems, ripple counters are widely used for data recognition and bit data stream control, for example. Ripple counters used in most digital systems contain a number of D-type flip-flops (DFFs) to count clocks during a specific time interval. With the count of clocks, the digital system recognizes the number of bits that are inputted or outputted through the assigned pin. For example, U.S. Pat. No. 6,853,698 granted to Nguyen on Feb. 8, 2005 discloses a ripple counter circuit that includes series-connected DFFs for counting input clock pulses.

Conventional ripple counters have setup and hold times. In a case where the pulse widths of the input clocks are narrower than the critical time period specified by their setup and hold times, the ripple counters may function incorrectly.

SUMMARY OF THE INVENTION

According to one aspect of the present invention, there is provided an apparatus for counting input pulses during a specific time interval. The apparatus comprises an input gating circuit for input gating and producing a clock edge recovery output signal and a counter circuit for counting the pulses contained in the clock edge recovery output signal. The input gating circuit produces the clock edge recovery output signal in response to a clock signal and an input gating signal. The clock signal contains the input pulses having edges of first and second directions. The second direction of the edges is an opposite to the first direction. The clock edge recovery output signal contains a respective full clock pulse for each of either of the first and second direction edges of the clock signal that occurs while the input gating signal is in an enable state and when the gating signal transitions from the enable state to a disable state.

For example, the input gating circuit comprises a clock gating circuit for gating the clock signal using the input gating signal to produce a gated clock signal. The gated clock signal includes a short clock pulse when the input gating signal transitions to a disable state during a clock pulse of the clock signal.

The input gating circuit may further comprises a combination logic circuit for producing a first direction edge in the clock edge recovery output signal for each transition in the gated clock signal that corresponds with the first direction edge of the clock signal and for producing a second direction edge in the clock edge recovery output signal for each second direction edge of the clock signal.

For example, the clock gating circuit includes a latch circuit and a gating logic circuit. The clock gating circuit latches the logic state of the input gating signal in response to the clock signal. By the latch circuit, a latch output signal is produced. In response to the latch output signal, the input gating signal and the clock signal, the gating logic circuit produces the gated clock signal.

The combination logic circuit may include a latch having set and reset inputs. The set input receives the clock signal and the reset input receives the gated clock signal. The clock edge recovery output signal produced by the latch contains the full pulse of the clock signal, even though the gating signal transitions from the enable state to a disable state.

According to another aspect of the present invention, there is provided a method for counting input pulses. The method comprises: receiving a clock signal containing the input pulses and an input gating signal; performing clock edge recovery of the input pulses of the clock signal to produce a clock edge recovery output signal containing gated clock pulses and clock edge recovered pulses; and counting the pulses contained in the clock edge recovery output signal with a counter circuit having a plurality of flip-flop (FF) circuits that are serially connected, the counter circuit having feedback loops, the plurality of FF circuits including a first FF circuit for receiving the clock edge recovery output signal as clock source, each of the remaining FF circuits of the plurality of FF circuits taking clock source from the output of the previous FF circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1A illustrates a simplified ripple counter used in a digital system;

FIG. 1B illustrates clock signals found in the ripple counter shown in FIG. 1A;

FIG. 2A illustrates an example of desired clock signals;

FIG. 2B illustrates another example of desired clock signals;

DETAILED DESCRIPTION

Figure 3:
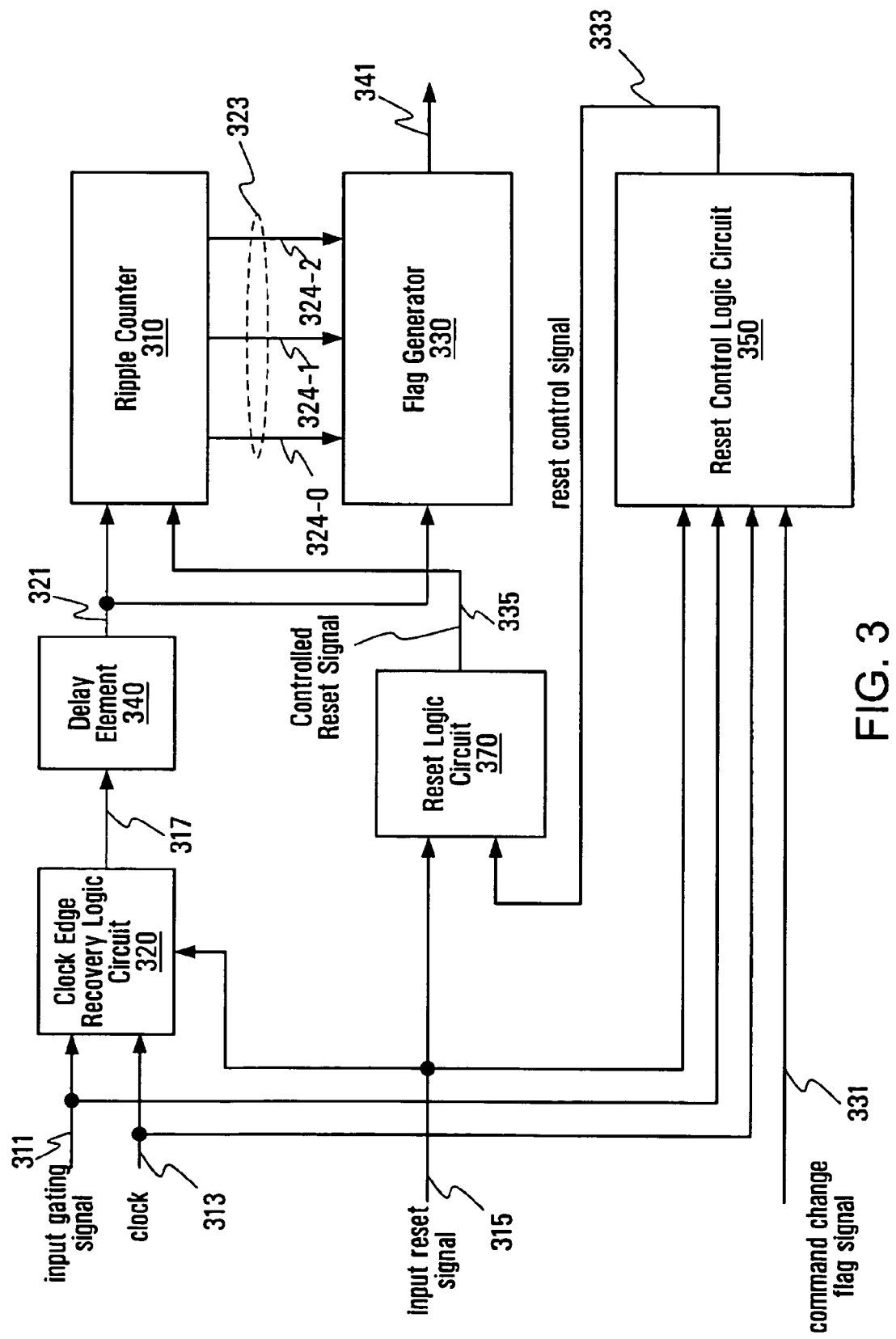
FIG. 3 is a block diagram of a pulse counter according to an embodiment of the present invention.

In the following detailed description of sample embodiments of the present invention, reference is made to the accompanying drawings, which form a part hereof, and in which is shown by way of illustration of specific sample embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

A simplified description of a ripple counter is now presented with reference to FIGS. 1A and 1B. FIG. 1A shows a ripple counter for counting clock pulses during a specific time interval. FIG. 1B shows signals referred to in FIG. 1A.

Referring to FIGS. 1A and 1B, an input gating signal 111 representing a time interval Tc (i.e., the specific time interval) and a clock signal 113 having clock pulses are fed to an input control gate 115 which in turn provides a gated clock signal 117 to a ripple counter 119. Therefore, while the input gating signal 111 is "high" during the time interval Tc, the ripple counter 119 counts the pulses of the gated clock signal 117. Counting in the ripple counter 119 is performed based on clock transitions. Depending on the timing of the input gating signal 111 and the clock signal 113, there may be a short clock pulse at the end of the gated clock signal 117. This is shown to be the case for the sixth pulse of the gated clock signal 117. The ripple counter 119 may operate properly or not depending on the pulse width of the clock.

The ripple counter used in most digital systems contain sequential elements such as D-type flip-flops (DFFs). Sequential elements, such as DFFs, have set timing constraints that must be observed if they are to work correctly. Two of these are the setup and hold times that specify the amount of time for which the data input must not change before and after the rising clock edge, respectively. Failure to observe these constraints may result in unexpected behaviour from the element. The overlap 120 between the clock 113 and input gating signal 111, is smaller than the minimum hold time defined in a system specification. In some implementations, the overlap 120 fluctuates depending on PVT (process/voltage/temperature) variations. Ideally, the last clock pulse of the gated clock signal (the 6th clock pulse for the gated clock signal 117 of FIG. 1B) should have the same pulse width as any other. In the example of FIGS. 1A and 1B, there is only a small timing margin between the input gating signal 111 and clock 113 to prevent such malfunctions from occurring.

Known counters do not provide a clear solution for the mismatch between clock and data input. Because of this problem, the input gating signal and the clock should have enough timing margin to cover entirely each of the clock transitions that one wants to include to avoid any clock glitch caused by transitions of the input gating signal.

FIGS. 2A and 2B show desired clock signals for processing by ripple counters. In FIG. 2A, the trailing edge 211 of the input gating signal 202 is overlapped with the 6th clock pulse of clock signal 200 after the input gating signal 202 transitions to the enable state (i.e., logic "high"). The gated clock signal 204 has the full clock pulse of the 6th pulse. In FIG. 2B, the trailing edge 221 of the input gating signal 208 is overlapped with the 5th clock pulse of clock signal 206 after the input gating signal 208 transitions to the enable state. The gated clock signal 210 has the full clock pulse of the 5th pulse. There may be a case where the front edge 223 of the input gating signal 208 is overlapped with a pulse of the clock signal 206. However, the circuit is prevented from producing a pulse from such overlapping.

It is desired that the full high state of each clock pulse on the trailing edge side of clock is recovered and provided to the ripple counter used in the digital logic system, so that the ripple counters properly operate.

FIG. 3 shows a pulse counter according to one embodiment of the present invention, which has a clock edge recovering function. Other logic circuitries are included to obtain the start point of the ripple counter as an initial setting to the ripple counter.

Referring to FIG. 3, an input gating signal 311, a clock signal 313 and an input reset signal 315 are fed to a clock edge recovery logic circuit 320 that performs the function of input gating. The clock edge recovery logic circuit 320 produces an edge recovery output signal 317 that is delayed by a delay element 340. The clock signal 311 contains a plurality of pulses. Each pulse has a width represented by a first direction or rising edge and a second direction or falling edge. The delay element 340 provides a delayed clock signal 321 to a ripple counter 310 and a flag generator 330. The ripple counter 310 provides N counting output signals 323 to the flag generator 330. N is an integer greater than 1. In this embodiment, N is 3 and a group of output signals 324-0, 324-1 and 324-2 are comprised in the counting output signals 323. While FIG. 3 shows a ripple counter 310, more generally the delayed clock signal 321 may be provided to any pulse counting circuit. In the illustrated example, flag generator 330 operates to produce a counting status indication signal 341 that is used for subsequent circuits (not shown) to find their point of logic. More generally, any logic operation finding circuit is contemplated that operates to process the counter outputs to generate one or more signals that define a point of logic.

The input gating signal 311, the clock signal 313 and the input reset signal 315 as well as a command change flag signal 331 are fed to a reset control logic circuit 350 which in turn provides a reset control signal 333 to a reset logic circuit 370. In response to the reset control signal 333 and the input reset signal 315, the reset logic circuit 370 provides a controlled reset signal 335 to the ripple counter 310. In response to the delayed clock signal 321 and the group of output signals 324-0, 324-1 and 324-2, the flag generator 330 provides the counting status indication signal 341. In the illustrated example, it is assumed that the reset input 315 is a hard reset, for example at a specific reset pin, while the command change flag signal 331 contains an internally generated reset each time a new command is received. One or both resets may be included in a given implementation.

In operation, the clock edge recovery logic circuit 320 produces the edge recovery output signal 317 containing a full clock pulse for each rising edge of the clock 313 that occur while the input gating signal 311 is in an enable state. The ripple counter 310 is connected to count the pulses contained in the delayed clock signal 321 from the delay element 340. The delay element 340 is inserted to adjust the signal timings between the edge recovery output signal 317 and the controlled reset signal 335. In the illustrated embodiment, the ripple counter 310 functions to count pulses in the delayed clock signal 321. It counts eight pulses (by counting zero to seven) and then starts again at zero. It does so continuously until it is reset by the controlled reset signal 335.

The reset control logic circuit 350 controls reset operation of the circuit. In a particular implementation, the reset control logic circuit 350 operates to generate the reset control signal 333, in response to the input reset signal 315, the input gating signal 311, the clock signal 313 and the command change flag signal 331. A specific circuit of the reset control logic circuit 350 will be described below with reference to FIGS. 7A and 7B.

The reset logic circuit 370 generates the controlled reset signal 335 from the reset control signal 333 such that the controlled reset signal 335 is only generated if input reset signal 315 is in an enable state.

The flag generator circuit 330 functions to generate the counting status indication signal 341 each time the ripple counter 310 counts up to eight.

Figure 4A:
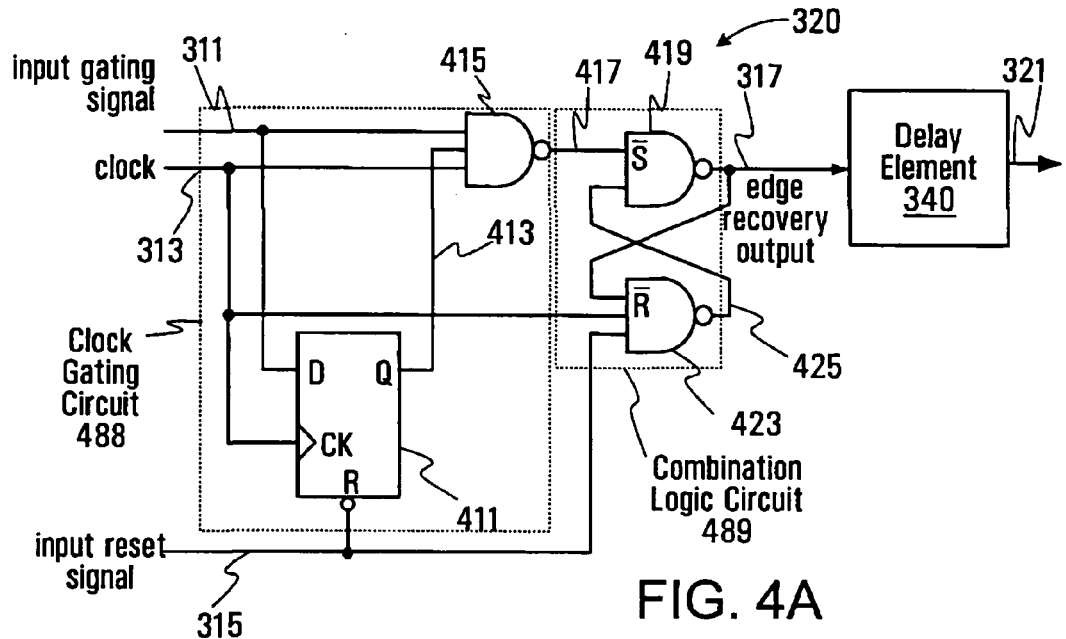
FIG. 4A shows an example implementation of a clock edge recovery logic circuit shown in FIG. 3.

FIG. 4A shows a detailed circuit of an example implementation of the clock edge recovery logic circuit 320 for clock edge recovering. The partially overlapped clock in the last edge (or the trailing edge) of the input gating signal 311 is recovered through the clock edge recovery logic circuit 320. A clock pulse that partially overlaps with the rising edge (or the front edge) of the input gating signal 311 is, however, ignored, because it is not to be included in the counting numbers. The edge recovery logic circuit 320 has a clock gating circuit 488 for gating the clock signal 313 using the input gating signal 311 to produce a gated clock signal 417, the gated signal including an incomplete pulse when the input gating signal transitions to a disable state during a clock pulse. Also shown is a combination logic circuit 489 that produces a rising edge in the internal clock signal for each transition in the gated clock signal that corresponds with a rising edge of the clock signal, and produces a falling edge in the internal clock signal for each falling edge of the clock. Particular implementations of the clock gating circuit 488 and the combination logic circuit 489 will now be described with further reference to the detailed examples of FIG. 4A. More generally, it is to be understood that any circuit that achieves the above-described functionality can be employed.

In the particular example illustrated, the clock gating circuit 488 has a DFF 411 that receives the input gating signal 311 to its D input, receives the clock signal 313 to its clock input CK, and receives the reset input reset signal 315 to its R input. The DFF 411 is reset when the input reset signal 315 is in "low" state. The DFF 411 produces a Q output signal 413 from its Q output. The Q output signal 413, the input gating signal 311 and the clock signal 313 are fed to respective inputs of a NAND gate 415 which in turn provides an output signal as the gated clock signal 417. The DFF 411 functions as a latch that holds the high logic state until the clock pulse is fed to its clock input CK.

The combination logic circuit 489 includes two NAND gates that are connected to form a set-reset ($\overline{SR}$) latch configuration. The gated clock signal 417 is fed to one input of a NAND gate 419 that forms part of the combination logic circuit 489. NAND gate 419 produces an output logic signal as the edge recovery output signal 317 that functions as an edge recovery output. The output signal 317, the clock signal 313 and the input reset signal 315 are fed to a NAND gate 423 which in turn provides a combined logic signal 425 to a second input of the NAND gate 419. The edge recovery output signal 317 from the NAND gate 419 is delayed by the delay element 340 and the delayed clock signal 321 is provided.

Figure 4B:
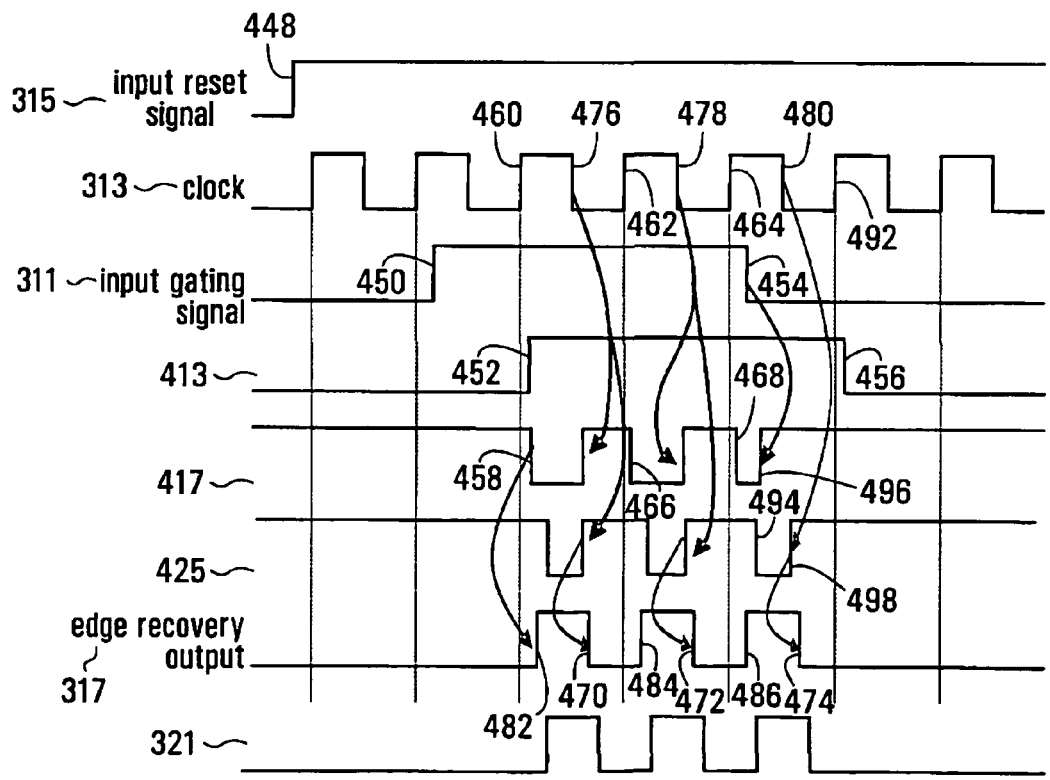
FIG. 4B is a timing diagram of signals for the clock edge recovery logic circuit shown in FIG. 4A.

The operation of the circuit of FIG. 4A will now be described by way of example with reference to FIG. 4B, which shows a set of example signals in the clock edge recovery logic circuit 320. More specifically, FIG. 4B shows an example signal for each of the input reset signal 315, the clock signal 313, the input gating signal 311, the DFF 411's Q output signal 413, the gated clock signal 417, the combined logic signal 425, the edge recovery output signal 317 and the delayed clock signal 321. For the particular example illustrated, it can be seen that during the period that the input gating signal 311 is high, it overlaps partially with a clock pulse at the beginning of the period, overlaps completely with two full pulses and overlaps partially with a clock pulse at the end of the period.

To begin, the input reset signal 315 functions to enable the entire circuit. Input reset signal 315 transitions to high at 448.

After the input gating signal 311 transitions to "high" at 450 (i.e., the front edge of the gating signal pulse), the Q output signal 413 of the DFF 411 transitions to "high" at 452 with the next rising edge 460 of the clock 313. After the input gating signal 311 transitions to low at 454 (the trailing edge of the gating signal pulse), the DFF 411's Q output signal 413 transitions to low at 456 with the next rising edge 492 of the clock 313. While input gating signal 311 and Q output signal 413 are both high, the gated clock signal 417 of the NAND gate 415 follows the inverse of the clock 313. Thus, the gated clock signal 417 has a falling edge at 458 corresponding with rising edge 460 of the clock 313, and rising edges 462, 464 of the clock 313 result in falling edges 466, 468 of the gated clock signal 417.

NAND gate 419 and NAND gate 423 are connected in the form of an $\overline{SR}$ latch with the gated clock signal 417 as the set (/S) input, and the input reset signal 315 as the reset (/R) input, and with the clock signal 313 functioning as an extra /R input. So long as the input reset signal 315 is high, the clock signal 313 functions as the /R input for the $\overline{SR}$ latch.

When the clock signal 313 goes low, the $\overline{SR}$ latch is reset, and the edge recovery output signal 317 goes low. In other words, the edge recovery output signal 317 has falling edges that follow the actual clock signal 313. Specifically, the edge recovery output signal 317 has falling edges 470, 472, 474 that follow falling edges 476, 478, 480 of the clock input signal 313.

Similarly, the gated clock signal 417 of NAND gate 415 functions as the /S input for the $\overline{SR}$ latch. Thus, when the gated clock signal 417 goes low at 458, 466, 468, the $\overline{SR}$ latch is set, and the edge recovery output signal 317 goes high at 482, 484, 486 respectively. In other words, the edge recovery output signal 317 has rising edges that follow the falling edges of the gated clock signal 417, which in turn correspond to rising edges of the actual clock 313.

Specifically, when, after the clock signal 313 goes high at 464, the input gating signal 311 goes low at the trailing edge 454, the clock edge recovery is necessary. In response to the high transition of the clock signal 313 at 464, the gated clock signal 417 goes low at 468. The edge recovery output signal 317 goes high at 486, with the result that the combined logic signal 425 goes low at 494. Then, the input gating signal 311 goes low at 454 and the gated clock signal 417 goes high at 496. However, since the combined logic signal 425 is already low, the edge recovery output signal 317 maintains its high state. Thereafter, the clock signal 313 goes low at 480 and the combined logic signal 425 goes high at 498. Since the gated clock signal 417 is already high, the edge recovery signal 317 goes low at 474. Thus, while during the clock pulse, the input gating signal transitions to the disable state, the pulse having the full clock pulse width appears in the edge recovery output signal 317. It can be seen that the edge recovery output signal 317 now contains three full pulses, one corresponding to each rising edge of the clock signal 313 during the period that input gating signal 311 is high. Then, the edge recovery output signal 317 from the NAND gate 419 is fed to the delay element 340 and the delayed clock signal 321 is provided therefrom. Using the delayed clock signal 321, perfect clock counting without any glitch can be achieved.

Figure 5A:
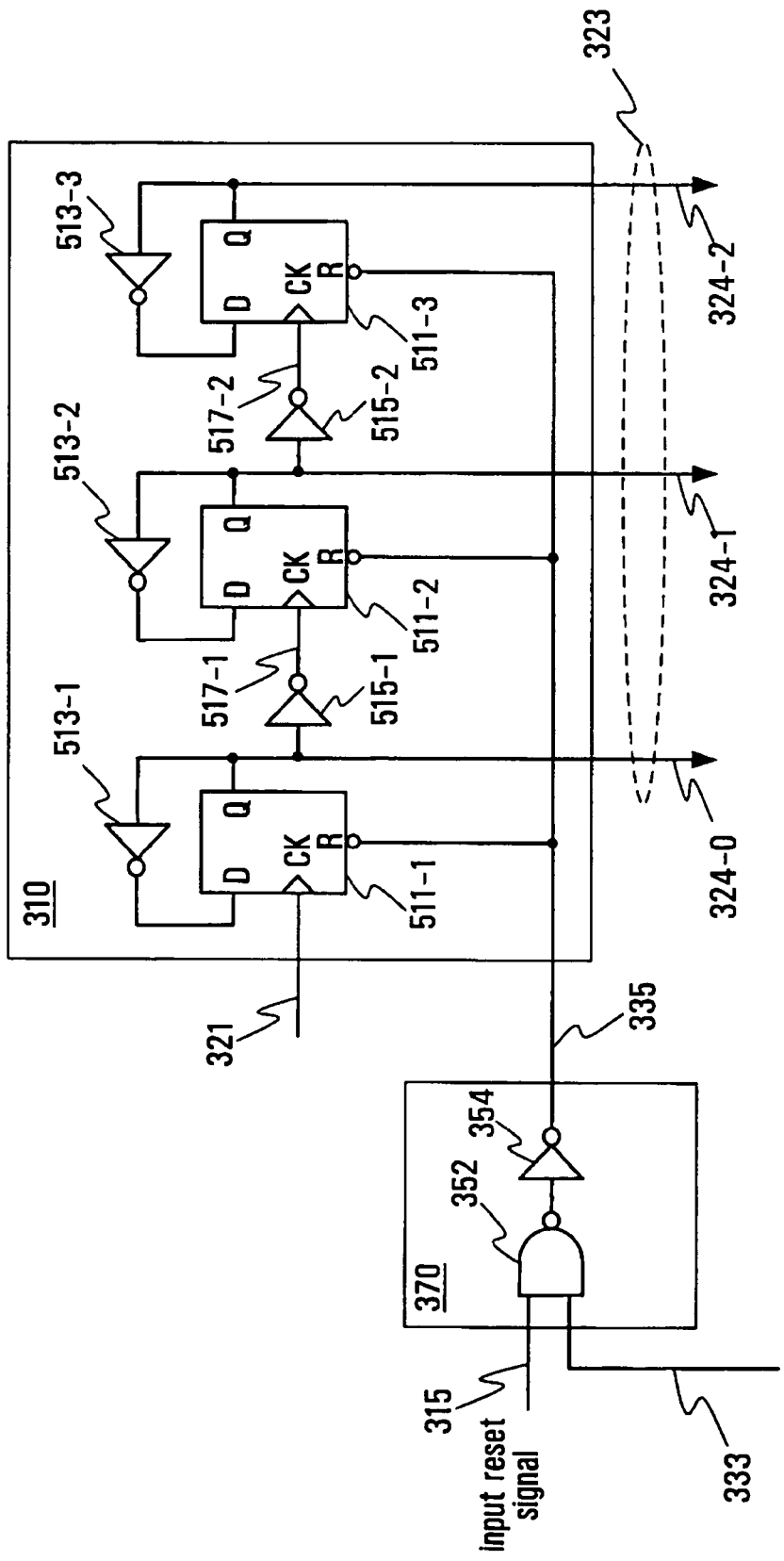
FIG. 5A is an example implementation of a ripple counter shown in FIG. 3.

FIG. 5A shows a detailed circuit of the ripple counter 310. In the illustrated example, the ripple counter 310 is a traditional ripple counter that includes N DFFs, N being an integer greater than 1. In the particular example, N is 3, and the ripple counter 310 has three DFFs 511-1, 511-2 and 511-3. Each of the three DFFs 511-1, 511-2 and 511-3 has a respective feedback inverter 513-1, 513-2 or 513-3 from its Q output to D input. The delayed clock signal 321 produced by the edge recovery circuit is connected to the clock input CK of the first DFF 511-1. The Q outputs of the DFF 511-1 and 511-2 are connected to provide clock input signals 517-1 and 517-2 to input CKs of the next DFFs 511-2 and 511-3, respectively, through inverters 515-1 and 515-2, respectively, such that DFF 511-2 and 511-3 each take their clock source from the previous DFF. The input reset signal 315 and the reset control signal 333 are fed to a reset logic circuit 370 including a NAND gate 352 and an inverter 354 that form an AND logic circuit. The reset control signal 333 is internally generated by reset control logic circuit described below. The controlled reset signal 335 from the reset logic circuit 370 is provided to the reset inputs R of the DFFs 511-1, 511-2 and 511-2 of the ripple counter 310. Each of the DFFs 511-1, 511-2 and 511-3 is reset when the controlled reset signal 335 is in "low" state. Using the ripple counter 310, a counting operation is done up to 8. The counter output for this case is indicated at 323, and includes output signals 324-0, 324-1 and 324-2 as identified earlier in the description of FIG. 3. More generally, for an N DFF implementation, the counting operation is done up to $2^N$.

Figure 5B:
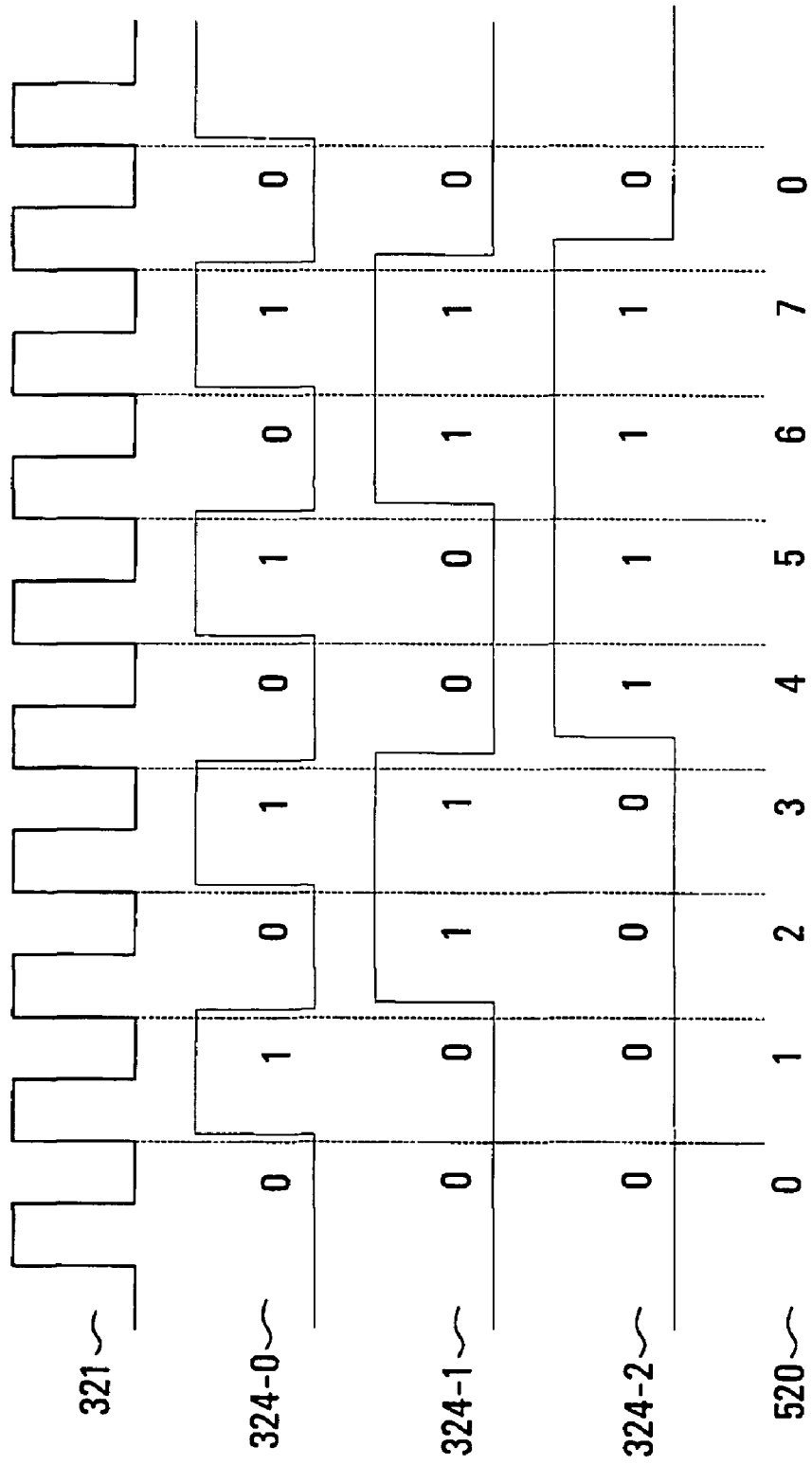
FIG. 5B is a timing diagram of signals for the ripple counter shown in FIG. 5A.

FIG. 5B shows the signals in the ripple counter 310. These include the delayed clock signal 321 and the counter output signals 324-0, 324-1 and 324-2. Also shown at 520 is the decimal representation of the state of the count output signals 324-0, 324-1 and 324-2. In the illustrated example, the delayed clock signal 321 has consecutive clock pulses that are counted. More generally, the delayed clock signal 321 may have bursts of clock pulses (in accordance with the length of the input gating signal as described above). The ripple counter 310 increments for each such clock pulse, and the time that it takes to count up to eight will vary depending on how long it takes for eight such clock pulses to be received.

Figure 6A:
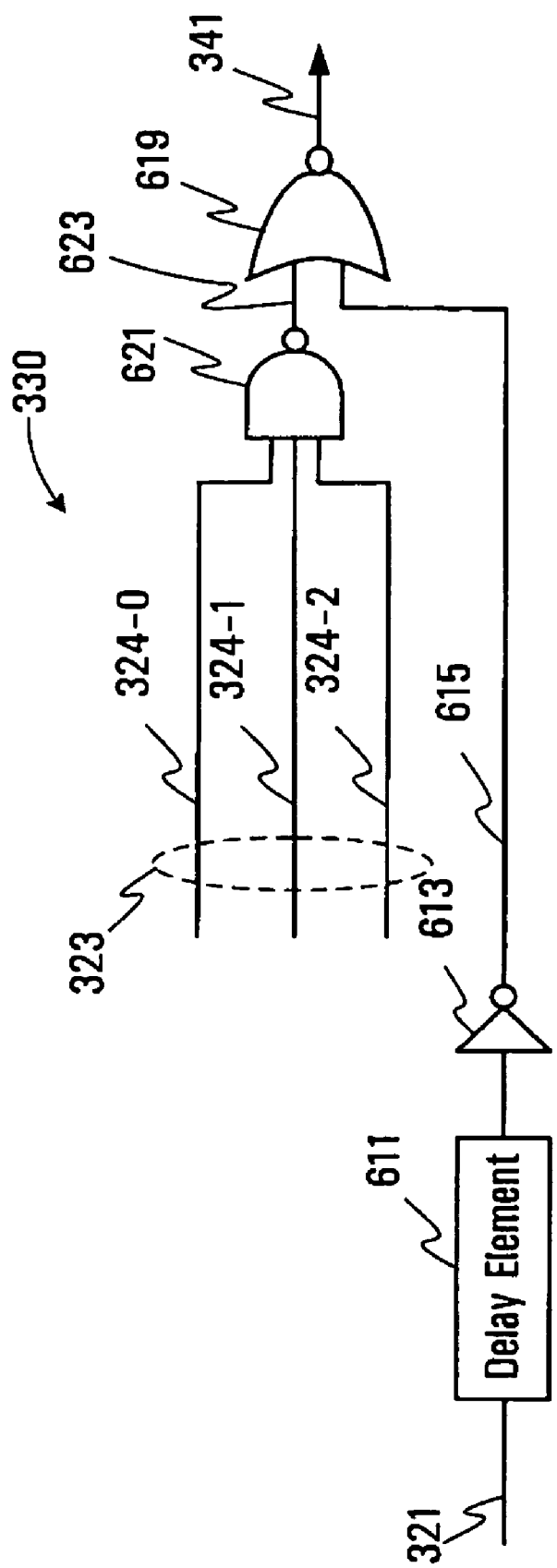
FIG. 6A is an example implementation of a flag generator shown in FIG. 3.

FIG. 6A shows an example of a detailed circuit of the flag generator 330 of FIG. 3. The purpose of the flag generator 330 is to generate an output after eight clock cycles of the gated clock (more generally after $2^N$ clock cycles of the gated clock). Referring to FIG. 6A, the delayed clock signal 321 is further delayed by a delay element 611 and the further delayed signal is inverted by an inverter 613. The inverted signal 615 is fed to one input of a 2-input NOR gate 619. The group of output signals 324-0, 324-1 and 324-2 included in the counting output signals 323 are fed to a NAND gate 621 and its output logic signal 623 is fed to the other input of the NOR gate 619 that provides the counting status indication signal 341.

Figure 6B:
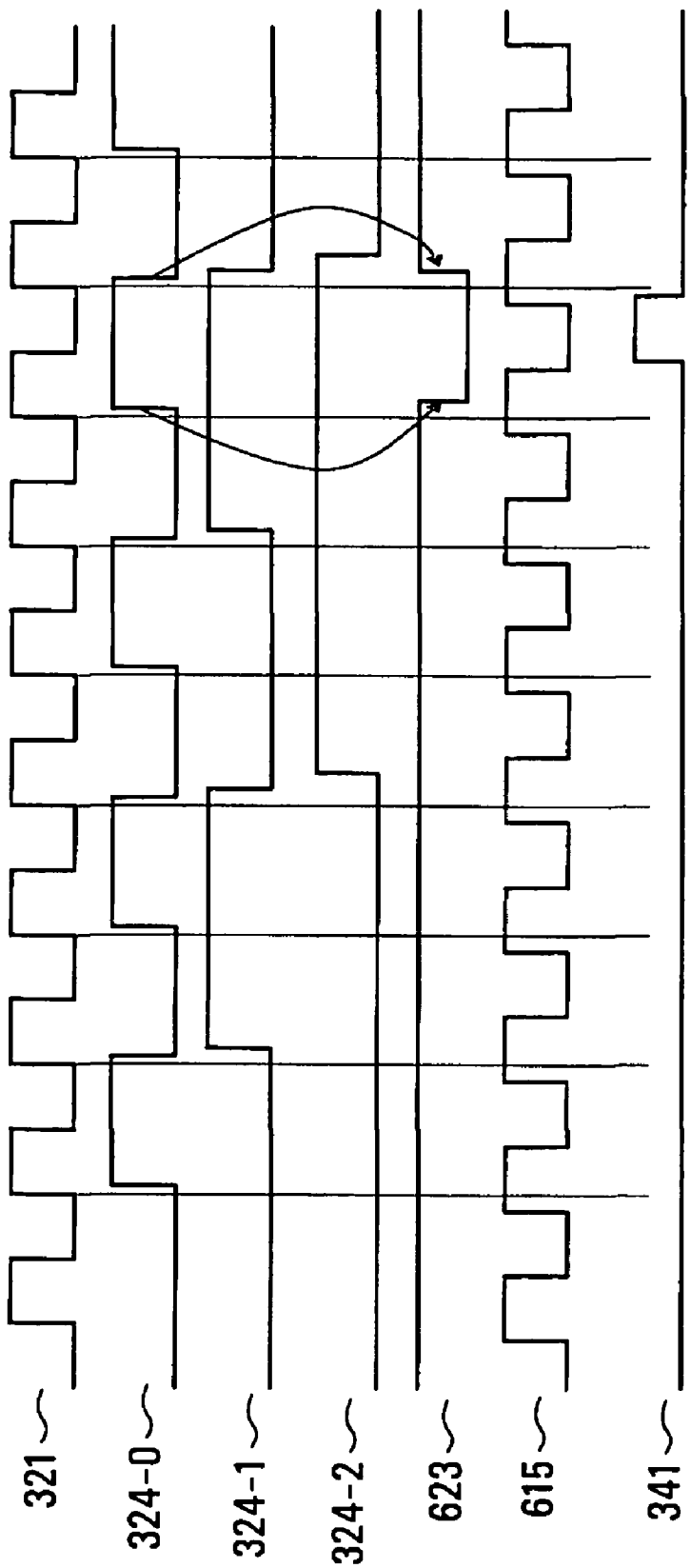
FIG. 6B is a timing diagram of signals for the flag generator shown in FIG. 6A.

FIG. 6B shows the signals in the flag generator 330 including the delayed clock signal 321, the count signals 324-0, 324-1 and 324-2, output logic signal 623, the delayed inverse clock signal 615, and the counting status indication signal 341. Referring to FIGS. 6A and 6B, when the three count signals 324-0, 324-1 and 324-2 are high, meaning that 8 cycles have been counted, the NAND gate 621's output logic signal 623 goes low for the duration of the last cycle. In the illustrated example, this is combined with the delayed inverse clock signal 615 in NOR gate 619, with the result that the counting status indication signal 341 goes high only for the second half of the last clock cycle of the delayed clock signal 321 as shown. The counting status indication signal 341 is issued as flag for subsequent logic operations to know when eight cycles have occurred. For example, if the subsequent logic operates on a byte-wise basis, this flag can be used to indicate when to next operate. Using this flag, subsequent logic starts operations related with latches and timing control in a digital logic system (not shown). The NOR gate 619 is connected to avoid any glitch problem due to the signal racing, after the delay element 611 and the inverter 613. The amount of delay in the delay element 611 is determined depending on the maximum frequency and device performance of each logic gate.

Figure 7A:
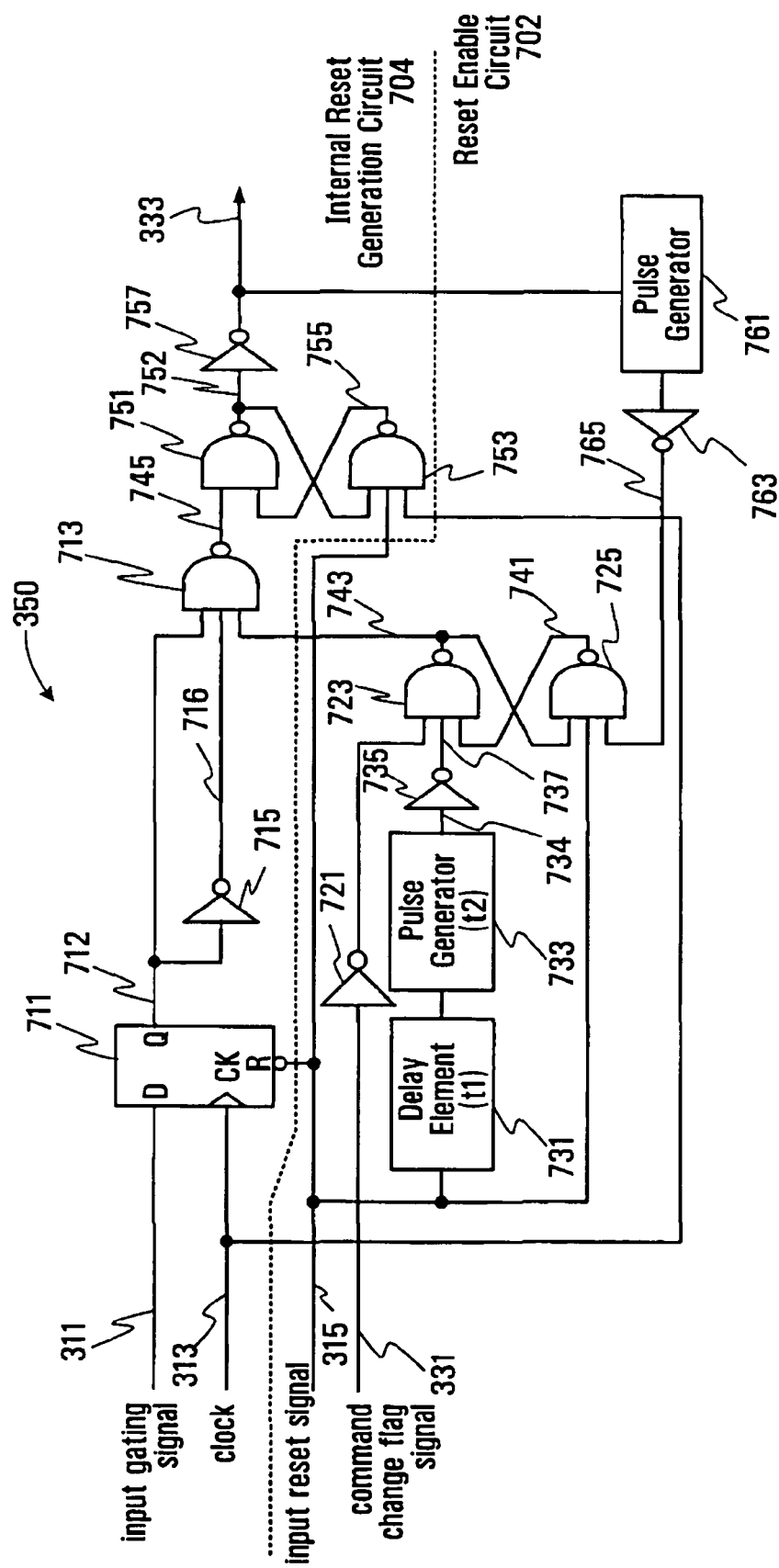
FIG. 7A is an example implementation of a reset control logic circuit shown in FIG. 3.

FIG. 7A shows an example of a detailed circuit of the reset control logic circuit 350. The reset control logic circuit for this implementation includes a reset enable circuit 702 that produces a reset enable signal 743 that enables reset for a period following a command on the command change signal 331 and for a period following a reset on the input reset signal 315. Also shown is an internal reset generation circuit 704 that operates when enabled by the reset enable signal 743 to generate an internal reset pulse on the reset control signal 333 following a positive transition on the input gating signal 311 and a subsequent positive transition of the clock 313.

Specific detailed implementations for the reset enable circuit 702 and the internal reset generation circuit 704 will now be described. Referring again to FIG. 7A, the input gating signal 311, the clock signal 313 and the input reset signal 315 are fed to the D input, the clock input CK and the reset input R of a DFF 711, respectively. The Q output signal 712 of the DFF 711 is fed to a NAND gate 713. The Q output signal 712 is inverted by an inverter 715 and the inverted signal 716 is fed to the NAND gate 713 with a time delay of the inverter 715. The command change flag signal 331 is inverted by an inverter 721 and the inverted signal is fed to a NAND gate 723. The input reset signal 315 is fed to a delay element 731 that delays the signal by time t1. A t1-delayed signal is fed to a pulse generator 733. In response to the delayed signal, the pulse generator 733 generates a pulse signal 734 having a pulse width t2. The pulse signal is inverted by an inverter 735 and the inverted signal (reset pulse signal) 737 is fed to the NAND gate 723. The input reset signal 315 is also fed to another NAND gate 725 having an output signal 741 which is fed to the NAND gate 723. An output signal (the reset enable signal 743) of the NAND gate 723 is fed to the NAND gates 725 and 713. The output signal 745 of the NAND gate 713 is fed to a NAND gate 751. The output signal 752 of the NAND gate 751, the clock signal 313 and the input reset signal 315 are fed to a NAND gate 753 which in turn provides an output signal 755 to the NAND gate 751. The NAND gate 751 outputs a logic reset signal 752, which is inverted by an inverter 757 and the inverted signal is provided as the reset control signal 333. The reset control signal 333 is fed to a pulse generator 761, the generated output signal of which is inverted by an inverter 763 to provide an inverted pulse signal (reset pulse signal) 765 to the NAND gate 725. NAND gates 723 and 725 are connected to form an $\overline{SR}$ latch with output (the reset enable signal 743). Similarly, NAND gates 751 and 753 are connected in an $\overline{SR}$ latch configuration with the logic reset signal 752.

Figure 7B:
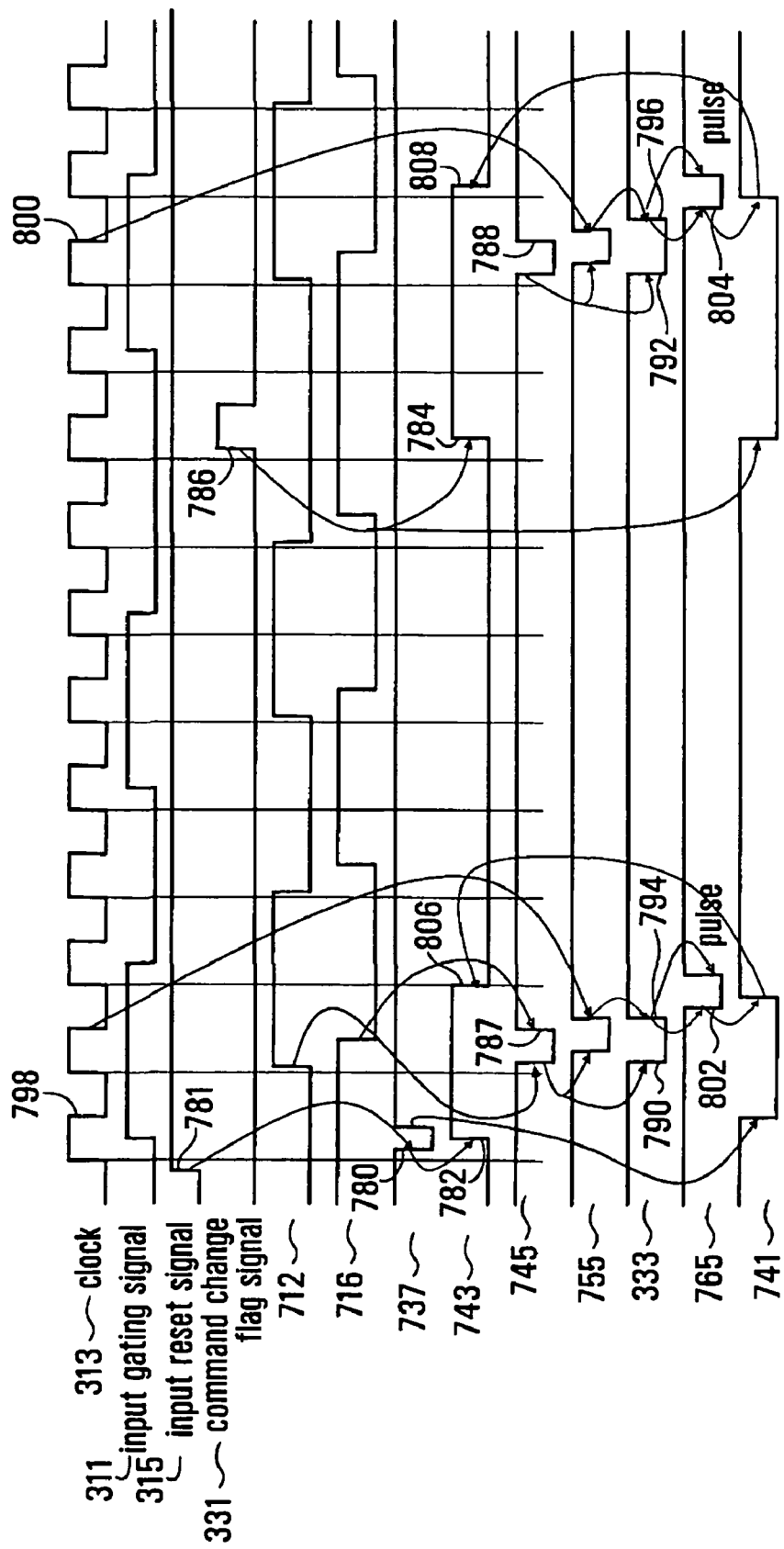
FIG. 7B is a timing diagram of signals for the reset control logic circuit shown in FIG. 7A.

FIG. 7B shows the signals in the reset control logic circuit 350. These include clock signal 313, input gating signal 311, input reset signal 315, command change flag signal 331, DFF 711's Q output signal 712, inverted signal 716, inverted signal (reset pulse signal) 737, reset enable signal 743, NAND gate 713's output signal 745, NAND gate 753's output signal 755, reset control signal 333, inverted pulse signal (reset pulse signal) 765 from the inverter 763 and NAND gate 725's output signal 741.

Referring to FIGS. 7A and 7B, the transition of the input gating signal to "high" means the start of a new operation. The command change flag denotes the assertion of a new command. New command assertion can reset the ripple counter. The input gating signal 311 only controls the clock counting until a new command is issued from a previous logic system that generates the input gating signal 311. The reset enable signal 743 is enabled by an initial "reset" operation and the command change signal 331 that indicates the start of new command which is generated from previous logic system. During the high state of the reset enable signal 743, the input gating signal 311 high state becomes valid.

When input reset signal 315 goes high, a pulse is generated in the inverted signal 737 by operation of the delay element 731, pulse generator 733, and inverter 735. An example of such a pulse is indicated at 780 following rising edge 781 on input reset signal 315. The reset enable signal 743 from NAND gate 723 goes high following such a pulse on the inverted signal 737 as indicated at 782.

In addition, a rising edge on the reset enable signal 743 also follows a rising edge on the command change flag signal 331. An example of this is shown with rising edge 784 following the command change flag pulse 786.

The Q output signal 712 of the DFF 711 and its inverted signal 716 (slightly delayed compared to the signal 712) fed to NAND gate 713 combine to produce a pulse in the output signal 745. The pulse lasts the duration of the delay between the pulse of the signal 712 and the pulse of the inverted signal 716 whenever the signal 712 goes high, and only if the reset enable signal 743 is also high at the same time. The amount of delay by the inverter 715 can be fine tuned by employing a varying odd number of inverters to generate pulses of the signal 716". In FIG. 7B, pulse 787 is shown on the signal 745 during the period of the reset enable signal 743 is active following rising edge 781 of the input reset signal 315, while pulse 788 is shown on the signal 745 during the period of the reset enable signal 743 is active following the input pulse 786 of the command change flag signal 331.

The downward transition of each pulse appearing on the output signal 745 from NAND gate 713 operates as a set input to the $\overline{SR}$ latch, and results in a rising edge in the logic reset signal 752 and a corresponding falling edge in the reset control signal 333. Specifically, falling edges 790, 792 correspond with pulses 787, 788. The next falling edge of the clock signal 313 following each time the $\overline{SR}$ latch is set operates as a reset input to the $\overline{SR}$ latch, and results in a falling edge in the logic reset signal 752 and a corresponding rising edge in the reset control signal 333. Specifically, rising edges 794, 796 of the reset control signal 333 correspond with falling edges 798, 800 of the clock signal 313. The reset control signal 333 operates as the main reset of the ripple counter.

Each rising edge of the reset control signal 333 results in a corresponding pulse in the logic reset signal 752 and a corresponding negative pulse in the inverted pulse signal (reset pulse signal) 765 as a result of pulse generator 761 and inverter 763. Negative pulses 802, 804 in the inverted pulse signal 765 are shown to follow rising edges 794, 796 of the reset control signal 333.

The inverted pulse signal 765 operates as a /reset input to the $\overline{SR}$ latch composed of NAND gates 723, 725. As a result, each pulse in the inverted pulse signal 765 resets the latch, and causes the reset enable signal 743 to transition to low. It can be seen that falling edges 806, 808 of the reset enable signal 743 correspond with the pulses 802, 804 in the inverted pulse signal 765. The result is that after being set, the reset enable signal 743 from the $\overline{SR}$ latch composed of NAND gates 723, 725 is not reset until after the pulse in the reset control signal 333 has completed. Thus, a single pulse in the reset control signal 333 is to initiate the ripple counter to be reset. So long as the reset enable signal 743 is reset, the reset control signal 333 stays high notwithstanding further transitions in the DFF 711's Q output signal 712 and its inverted signal 716.

With the above functionality, the ripple counter is reset in response to the input reset signal 315 and the reset control signal 333.

With the illustrated embodiment, selective reset operation is performed. Diverse input conditions can occur in digital logic systems. Using the reset control logic 350, only specified conditions generate the reset signal for the ripple counter. The feedback ripple operation ensures no overlapping or timing violation with sequential clock and pulse generation by the edge detection pulse generator. While a specific circuit has been provided that achieves this result, it is to be understood that the reset control logic can perform in a similar manner using different logic.

In the above described embodiments, the signals are active "high" logic signals. The logic "high" and "low" states of the signals may be represented by the high and low supply voltages VDD and VSS, respectively. The signals may, however, be active "low" signals, according to design preferences. The logic "high" and "low" states of the signals may be represented by the low and high supply voltages VSS and VDD, respectively. Also, the voltages with the device operation may be voltages derived from the "high" and "low" supply voltages VDD and VSS.

For example, in reference to FIG. 4B, the input gating signal 311 may be an active low logic signal. The front edge at 450 and the trailing edge at 454 that defines the specific gating interval can be falling and rising edges, respectively. In such a circuit configuration, the overlapped pulse of the clock signal with the trailing and rising edge will be fully recovered.

In the embodiments described above, the device elements and circuits are connected to each other as shown in the figures, for the sake of simplicity. In practical applications of the present invention to pulse counter apparatus, circuits, elements, devices, etc. may be connected directly to each other. As well, circuits, elements, devices, etc. may be connected indirectly to each other through other circuits, elements, devices, etc., necessary for operation of the pulse counter. Thus, in actual configuration of pulse counter apparatus, the circuit, elements, devices, etc. are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An apparatus for counting input pulses during a specific time interval, comprising:
   an input gating circuit for performing input gating and producing a clock edge recovery output signal in response to a clock signal and an input gating signal, the clock signal containing the input pulses having edges of first and second directions, the second direction of the edges being an opposite to the first direction, the clock edge recovery output signal containing a respective full clock pulse for each of either of the first and second direction edges of the clock signal that occurs while the input gating signal is in an enable state and when the gating signal transitions from the enable state to a disable state; and
   a counter circuit for counting the pulses contained in the clock edge recovery output signal.

2. The apparatus of claim 1 wherein the input gating circuit comprises:
   a clock gating circuit for gating the clock signal using the input gating signal to produce a gated clock signal, the gated clock signal including a short clock pulse when the input gating signal transitions to a disable state during a clock pulse of the clock signal.

3. The apparatus of claim 2 wherein the input gating circuit further comprises:
a combination logic circuit for producing a first direction edge in the clock edge recovery output signal for each transition in the gated clock signal that corresponds with the first direction edge of the clock signal and for producing a second direction edge in the clock edge recovery output signal for each second direction edge of the clock signal.

4. The apparatus of claim 3 wherein the clock gating circuit comprises:
a latch circuit for latching the logic state of the input gating signal in response to the clock signal, thereby producing a latch output signal; and
a gating logic circuit for producing the gated clock signal in response to the latch output signal, the input gating signal and the clock signal.

5. The apparatus of claim 4 wherein the combination logic circuit comprises:
a latch having a set input for receiving the clock signal and a reset input for receiving the gated clock signal.

6. The apparatus of claim 1 further comprising:
a reset control logic circuit for controlling a reset operation of the counter circuit.

7. The apparatus of claim 6 wherein the reset control logic circuit comprises:
a reset generation circuit for producing a reset control signal in response to the input gating signal, the clock signal, a reset signal and a command change signal.

8. The apparatus of claim 7 wherein the reset control circuit further comprises:
a reset enable circuit for producing a reset enable signal that enables reset for a period following a command on the command signal and for a period following a transition to an enable state on the reset signal.

9. The apparatus of claim 8 wherein the reset generation circuit comprises:
an internal reset generation circuit for generating an internal reset pulse following a positive transition on the input gating signal and a subsequent positive transition of the clock, when enabled by the reset enable signal.

10. The apparatus of claim 9 wherein the internal reset generation circuit comprises:
an input gating signal delay circuit for delaying the input gating signal to provide a delayed input gating signal; and
a logic circuit for logically combining the reset enable signal and the delayed input gating signal to provide the reset control signal.

11. The apparatus of claim 10 wherein the input gating signal delay circuit comprises:
a D-type flip-flop for receiving the input gating signal as D input and clock signal as clock input and for producing a Q output; and
an inverter circuit for producing a delayed inverse of the Q output after a processing delay,
the Q output and the delayed inverse of the Q output together being input to the logic circuit for logically combining the reset enable signal and the delayed input gating signal to provide the reset control signal.

12. The apparatus of claim 11 wherein the inverter circuit comprises:
an odd number of inverters that produces the delayed inverse of the Q output, each of the inverters providing a signal delay.

13. The apparatus of claim 8 wherein the reset enable circuit comprises:
a delay circuit for delaying the reset signal to provide a delayed reset signal; and
a pulse generator for generating a pulse signal in response to the delayed reset signal to provide a reset pulse signal.

14. The apparatus of claim 13 wherein the reset enable circuit further comprises:
a second pulse generator for generating a second pulse signal in response to the reset control signal, the second pulse signal being provided for self-generating the reset control signal.

15. The apparatus of claim 14 wherein the reset enable circuit further comprises:
a logic circuit for logically combining the second pulse signal with the reset pulse signal.

16. The apparatus of claim 1 wherein the counter circuit comprises:
a plurality of flip-flop (FF) circuits that are serially connected for counting the pulses contained in the clock edge recovery output signal, the counter circuit having feedback loops, the plurality of FF circuits including a first FF circuit for receiving the clock edge recovery output signal as clock source, each of the remaining FF circuits of the plurality of FF circuits taking clock source from an output of the previous FF circuit, each of the FF circuits providing an output signal.

17. The apparatus of claim 16, further comprising:
a logic operation finding circuit for finding a point of the logic operation of the counter circuit in response to the clock edge recovery output signal and the output signals from the FF circuits.

18. The apparatus of claim 17, wherein the logic operation finding circuit comprises:
a flag generation circuit for issuing a flag in response to the clock edge recovery output signal and the output signals from the FF circuits, the flag being for a next logic system to start operation related to latch and timing control therein.

* * * * *